United States Patent
Son et al.

(10) Patent No.: US 7,956,407 B2
(45) Date of Patent: Jun. 7, 2011

(54) VERTICAL TYPE SEMICONDUCTOR DEVICE, METHOD OF MANUFACTURING A VERTICAL TYPE SEMICONDUCTOR DEVICE AND METHOD OF OPERATING A VERTICAL SEMICONDUCTOR DEVICE

(75) Inventors: Yong-Hoon Son, Yongin-si (KR); Jong-Wook Lee, Yongin-si (KR); Jong-Hyuk Kang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 12/620,923

(22) Filed: Nov. 18, 2009

(65) Prior Publication Data
US 2010/0123182 A1 May 20, 2010

(30) Foreign Application Priority Data
Nov. 18, 2008 (KR) .................. 10-2008-0114765

(51) Int. Cl.
*H01L 29/792* (2006.01)

(52) U.S. Cl. ........ 257/324; 257/328; 257/329; 257/214; 257/E29.309

(58) Field of Classification Search .................. 257/324, 257/328, 329, 214, E29.309
See application file for complete search history.

(56) References Cited

FOREIGN PATENT DOCUMENTS
| KR | 10-2006-0001876 | 1/2006 |
| KR | 10-2007-0089441 | 8/2007 |
| KR | 10-2008-0018040 | 2/2008 |

*Primary Examiner* — Long Pham
(74) *Attorney, Agent, or Firm* — Harness, Dickey & Pierce, P.L.C.

(57) ABSTRACT

A vertical pillar semiconductor device includes a substrate, a single crystalline semiconductor pattern, a gate insulation layer structure and a gate electrode. The substrate may include a first impurity region. The single crystalline semiconductor pattern may be on the first impurity region. The single crystalline semiconductor pattern has a pillar shape substantially perpendicular to the substrate. A second impurity region may be formed in an upper portion of the single crystalline semiconductor pattern. The gate insulation layer structure may include a charge storage pattern, the gate insulation layer structure on a sidewall of the single crystalline semiconductor pattern. The gate electrode may be formed on the gate insulation layer structure and opposite the sidewall of the single crystalline semiconductor pattern. The gate electrode has an upper face substantially lower than that of the single crystalline semiconductor pattern.

14 Claims, 9 Drawing Sheets

//VERTICAL TYPE SEMICONDUCTOR DEVICE, METHOD OF MANUFACTURING A VERTICAL TYPE SEMICONDUCTOR DEVICE AND METHOD OF OPERATING A VERTICAL SEMICONDUCTOR DEVICE

CROSS REFERENCE TO RELATED APPLICATION

This application claims priority under U.S.C. §119 to Korean Patent Application No. 10-2008-00114765, filed on Nov. 18, 2008, in the Korean Intellectual Property Office (KIPO), the entire contents of which are incorporated herein by reference.

BACKGROUND

1. Field

Example embodiments relate to a vertical type semiconductor device, a method of manufacturing a vertical type semiconductor device and method of operating a vertical type semiconductor device. More particularly, example embodiments relate to a vertical type semiconductor device having a single transistor, a method of manufacturing a vertical type semiconductor device having a single transistor and method of operating a vertical type semiconductor device having a single transistor.

2. Description of the Related Art

Generally, a DRAM (dynamic random access memory) device includes a unit cell requiring one transistor and one capacitor per bit. The DRAM device stores data using the capacitor which may be charged or un-charged. The DRAM device loses data stored in each cell when power is not supplied. Because capacitors leak charge, the data eventually fades unless the capacitor charge is refreshed periodically.

Capacitance of the capacitor may be increased in order to increase the refresh period. Because the capacitance is proportional to physical size of the capacitor, integrating the DRAM device in higher density may be difficult.

Accordingly, a 1T DRAM which may be a capacitorless bit cell design has been developed. The 1T DRAM has a structure in which a transistor may be formed on a surface of a floating body. The 1T DRAM stores data by storing or erasing a charge in the floating body. Also, the 1T DRAM reads the stored data using a detectable shift in the threshold voltage of the transistor caused by stored charges in the floating body.

However, the shift in the threshold voltage of the transistor caused by stored charges may be smaller. As a result, when data stored in the transistor is read, errors caused from a read sensing margin may occur. Also, power consumption becomes larger because of frequent refresh operations.

SUMMARY

Example embodiments provide a vertical type semiconductor device of which a read sensing margin may be increased. Example embodiments provide a method of manufacturing a vertical type semiconductor device of which a read sensing margin may be increased. Example embodiments provide a method of operating a vertical type semiconductor device of which a read sensing margin may be increased.

According to example embodiments, a vertical pillar semiconductor device may include a substrate including a first impurity region; a single crystalline semiconductor pattern on the first impurity region, the single crystalline semiconductor pattern having a pillar shape substantially perpendicular to the substrate and including a second impurity region in an upper portion of the single crystalline semiconductor pattern; a gate insulation layer structure including a charge storage pattern, the gate insulation layer structure on a sidewall of the single crystalline semiconductor pattern; and a gate electrode on the gate insulation layer structure and opposite the sidewall of the single crystalline semiconductor pattern, the gate electrode having an upper face lower than that of the single crystalline semiconductor pattern.

The charge storage pattern may include at least one of a silicon nitride and a metal nitride. The vertical pillar semiconductor device may further include a first hard mask pattern enclosing an upper sidewall of the single crystalline semiconductor pattern, wherein the gate insulation layer structure has a linear shape and is on a bottom surface of the first hard mask pattern, a sidewall of the single crystalline semiconductor pattern and the substrate.

The vertical pillar semiconductor device may further include a channel doping region below a portion of the single crystalline semiconductor pattern configured to contact the gate insulation layer structure, the channel doping region changing a threshold voltage using a pair of electrons and holes generated according to electric conditions applied to the gate electrode, the first impurity region and the second impurity region. Charges may be stored in the charge storage pattern for expanding a memory window. The gate insulation layer structure may include an insulation layer pattern, the charge storage pattern and a blocking dielectric layer pattern that are laterally stacked.

The insulation layer pattern may include silicon oxide. The substrate may further include an active region and an isolation layer, the substrate being made of single crystalline semiconductor material. The active region and the isolation layer may have a shape extending along a first direction. The gate electrode may have a linear shape extending along a second direction substantially perpendicular to the first direction.

The first hard mask pattern may include silicon nitride and may have an upper face having a surface even with the single crystalline semiconductor pattern. The vertical pillar semiconductor device may further include a pad insulation layer pattern between the substrate and a lower surface of the gate electrode, wherein the pad insulation layer pattern includes silicon nitride.

The vertical pillar semiconductor device may further include first and second insulating interlayers on the first hard mask pattern; at least one bit line on the second insulating interlayer; a second hard mask pattern on the at least one bit line; and at least one spacer on a sidewall of the at least one bit line. The vertical pillar semiconductor device may further include a third insulating interlayer covering the at least one bit line; a contact plug formed through the second and third insulating interlayers to contact an upper face of the single crystalline semiconductor pattern; and a wiring on the contact plug.

According to example embodiments, a method of manufacturing a vertical pillar semiconductor device may include forming a first impurity region in a substrate; forming a single crystalline semiconductor pattern having a pillar shape perpendicular to the substrate; forming a second impurity region in an upper portion of the single crystalline semiconductor pattern; forming a gate insulation layer structure including a insulation layer pattern, a charge storage pattern and dielectric layer pattern on a sidewall of the single crystalline semiconductor pattern; and forming a gate electrode on the gate insulation layer structure, the gate electrode opposite the single crystalline semiconductor pattern and having an upper face lower than that of the single crystalline semiconductor pattern.

The method may further include storing a charge in the charge storage pattern in order to expand a memory window. The single crystalline semiconductor pattern may be formed by a laser epitaxial growth (LEG) process or a selective epitaxial growth (SEG) process. The charge storage layer pattern may be formed using a material having charge trap sites. The charge storage layer pattern may include at least one of silicon nitride and metal oxide.

The method may further include forming a first hard mask pattern enclosing an upper sidewall of the single crystalline semiconductor pattern, wherein the gate insulation layer structure has a linear shape and is on a bottom surface of the first hard mask pattern, a sidewall of the single crystalline semiconductor pattern and the substrate. The method may further include forming a channel doping region below a portion of the single crystalline semiconductor pattern configured to contact the gate insulation layer structure, the channel doping region changing a threshold voltage using a pair of electrons and holes generated according to electric conditions applied to the gate electrode, the first impurity region and the second impurity region.

Forming the first hard mask pattern may include forming the first hard mask pattern to have an upper face even with a surface of the single crystalline semiconductor pattern. The method may further include forming a pad insulation layer pattern between the substrate and a lower surface of the gate electrode, wherein the pad insulation layer pattern includes silicon nitride.

The method may further include forming first and second insulating interlayers on the first hard mask pattern; forming at least one bit line on the second insulating interlayer; forming a second hard mask pattern on the at least one bit line; and forming at least one spacer on a sidewall of the at least one bit line.

The method may further include a third insulating interlayer covering the at least one bit line; a contact plug formed through the second and third insulating interlayers to contact an upper face of the single crystalline semiconductor pattern; and a wiring on the contact plug.

According to example embodiments, a method of operating a DRAM device may include providing one transistor per cell of the DRAM device, the transistor having a gate insulation layer structure including a charge storage pattern; storing charge in the charge storage pattern for obtaining a memory window; recording data in a channel doping region of the transistor; and reading the recorded data. The method may further include adjusting the memory window by changing a programming voltage for storing the charge in the charge storage pattern.

According to example embodiments, the vertical type semiconductor device may include one transistor without a capacitor. Thus, the vertical type semiconductor device may be highly integrated. Also, the vertical type semiconductor device has an increased memory window, so that a read sensing margin may be increased and refresh characteristics may be improved.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments may be illustrated. Example embodiments may, however, be embodied in many different forms and should not be construed as limited to example embodiments set forth herein. Rather, these example embodiments may be provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
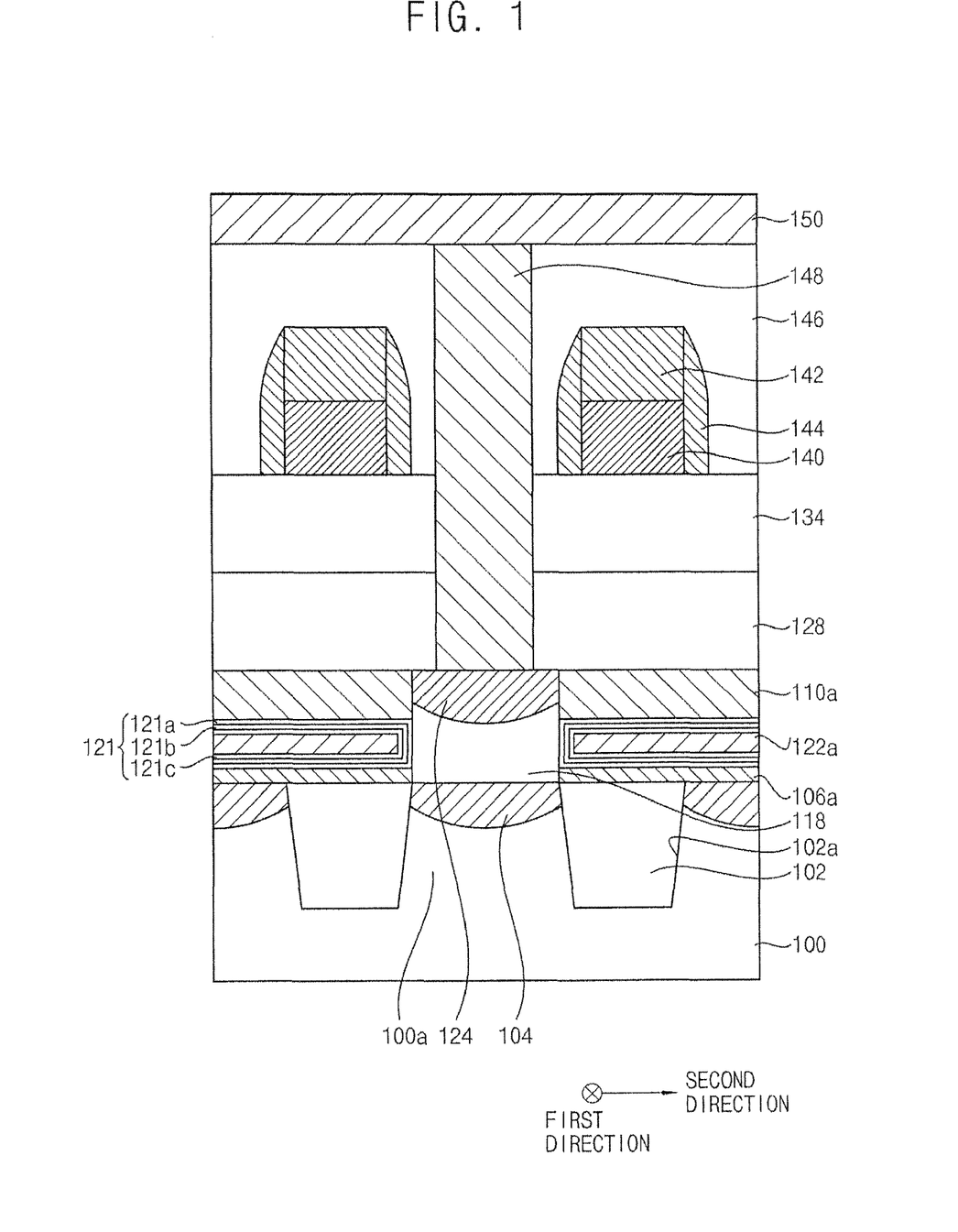
FIG. 1 is a cross-sectional view illustrating a DRAM device including a vertical pillar transistor in accordance with example embodiments.

FIG. 1 is a cross-sectional view illustrating a DRAM device including a vertical pillar transistor in accordance with example embodiments. Referring to FIG. 1, a substrate 100 having an active region 100a and an isolation layer 102 may be prepared. The substrate 100 may include single crystalline semiconductor material. For example, the substrate 100 may include single crystalline silicon.

A trench 102a may be formed at an upper portion of the substrate 100 and the trench may be filled with the isolation layer 102. The active region 100a and the isolation layer 102 have a shape extending along a first direction. The active region 100a and the isolation layer 102 may be alternatively formed at an upper portion of the substrate 100. A first impurity region 104 may be formed under a surface of the substrate 100 corresponding to the active region 100a. The first impurity region 104 may serve as a source region or a drain region.

A single crystalline semiconductor pattern 118 having a pillar shape may be foamed over the substrate corresponding to the active region. For example, the single crystalline semiconductor pattern 118 may include single crystalline silicon. The single crystalline semiconductor pattern 118 may be formed by a laser epitaxial growth (LEG) process or a selective epitaxial growth (SEG) process. In example embodiments, the single crystalline semiconductor pattern 118 may be formed by a LEG process, so that the single crystalline semiconductor pattern 118 may have fewer defects.

A gate insulation structure 121 may be formed on a sidewall of the single crystalline semiconductor pattern 118. The gate insulation structure 121 has a structure in which a gate insulation layer pattern 121a, a charge storage layer pattern 121b and a blocking dielectric layer pattern 121c may be sequentially stacked. The gate insulation layer pattern 121a may be formed using silicon oxide. The silicon oxide may be formed by thermally oxidizing a sidewall of the crystalline semiconductor pattern 118. The charge storage layer pattern 121b may be formed using material having charge trap sites. For example, the charge storage layer pattern 121b may include silicon nitride and/or metal oxide having higher permittivity.

As illustrated in FIG. 1, a gate electrode 122a opposite the single crystalline semiconductor pattern 118 may be formed on the gate insulation structure 121. For example, the gate electrode 122a may be formed on the blocking dielectric layer pattern 121c. The gate electrode 122a has an upper face whose level may be lower than that of the single crystalline semiconductor pattern 118. In example embodiments, the gate electrode 122a encloses all sidewalls of the single crystalline semiconductor pattern 118, which may be called a gate all around structure.

The gate insulation structure 121 may extend along the gate electrode 122a as well as the single crystalline semiconductor pattern 118. For example, the gate insulation structure 121 may extend along an upper face and a lower face of the gate electrode 122a. The gate electrode 122a has a linear shape extending along a second direction substantially perpendicular to the first direction. For example, the gate electrode 122a extends along a direction across the active region 100a.

A channel doping region may be formed in a portion of the single crystalline semiconductor pattern 118 opposite the gate electrode 122a. Because the single crystalline semiconductor pattern 118 has a floating body shape, when the transistor is operated, a pair of electrons and holes may be generated and may be accumulated in the channel doping region. A second impurity region 124 may be formed in portion of the single crystalline semiconductor pattern 118 positioned higher than the gate electrode 122a.

A first hard mask pattern 110a may be formed on the gate electrode 122a. The first hard mask pattern 110a has an upper face having a surface substantially horizontal to that of the single crystalline semiconductor pattern 118. The first hard mask pattern 110a may be formed using silicon nitride.

A pad insulation layer pattern 106a may be formed between the substrate 100 and a lower surface of the gate electrode 122a. The pad insulation layer pattern 106a electrically insulates the substrate 100 from the gate electrode 122a. The pad insulation layer pattern 106a may be formed using silicon nitride.

A DRAM including only one vertical pillar transistor per cell may be formed. The single crystalline semiconductor pattern 118 may be a channel region. Because the channel region is enclosed by the gate electrode 122a, the channel region has a floating body shape. The channel region of a floating body shape may serve as a data storage region. For example, holes may be accumulated in the channel region or removed from the channel region to change a threshold voltage of the vertical pillar transistor. Accordingly, data may be stored or erased.

In example embodiments, a negative charge may be stored in the charge storage pattern 121b. When the negative charge is stored in the charge storage pattern 121b, a threshold voltage according to data recorded in the vertical pillar transistor may become larger. As a result, a memory window of the DRAM may become larger.

An additional line wiring structure may be further formed on the vertical pillar transistor. For example, a spacer (not illustrated) may be formed on a sidewall of the gate electrode 122a having a linear shape extending along the second direction. A gap between the spacers may be filled with a first insulating interlayer 128.

A pad contact (not illustrated) through which electric signals are applied to the first impurity region 104 may be formed. The pad contact may be formed by a self-aligning process using the spacer. A second insulating interlayer 134 may be formed to cover the pad contact and the first hard mask pattern 110a. A direct contact (not illustrated)' partially contacting the pad contact may be formed on the second insulating interlayer 134.

A bit line 140 electrically connected to the pad contact through the direct contact and extending along the first direction may be formed on the second insulating interlayer 134. The bit line 140 may partially contact the pad contact. A second hard mask pattern 142 may be formed on the bit line 140. A spacer 144 may be formed on a sidewall of the bit line 140.

A gap between the bit lines 140 may be filled with a third insulating interlayer 146. The third insulating interlayer 146 covers the bit lines 140. A contact plug 148 may be formed through the second and third insulating interlayers to contact to an upper face of the single crystalline semiconductor pattern 118. The contact plug 148 may be disposed between the adjacent bit lines 140. The contact plug 148 may be electrically insulated from the bit lines 140. For example, the contact plug 148 may be electrically connected to the second impurity region 124. The contact plug may include metal and/or polysilicon.

A wiring 150 inputting or outputting electric signals to the second impurity region 124 may be formed on the contact plug 148. The wiring 150 may include a metal having lower resistance. The wiring 150 may have a linear shape extending along the second direction.

The DRAM device including the vertical pillar transistor may be operated without an additional capacitor in each cell by storing data in a channel region of the vertical pillar transistor. For example, a threshold voltage may be changed by injecting holes into the channel region with ion impacts or an avalanche effect. Accordingly, data may be stored in each cell and each cell may be sensed for reading the data.

The charge storage pattern may be formed in the gate insulation structure. A difference between a threshold voltage when data "0" may be stored in a cell and a threshold voltage when data "1" may be stored in a cell becomes sufficiently large by injecting charges into the charge storage pattern. The charge storage pattern may not be used for directly storing data but adjusts the difference between threshold voltages according to data stored in the vertical pillar transistor. The DRAM device does not require an additional capacitor and may include only one vertical pillar transistor per cell. As a result, the DRAM device may be highly integrated.

A method of operating the DRAM device in FIG. 1 will be described. A negative charge may be injected into charge storage patterns of the vertical pillar transistors, respectively. A memory window of each vertical pillar transistor may be increased by the injection of the negative charge. The injection process may be prior to reading data recorded in the DRAM device. The injection process may include a Fowler-Nordheim tunneling.

For example, the injection process may be prior to an initial operation of the DRAM device. In example embodiments, the negative charge may be injected into the charge storage patterns during the manufacture of the vertical pillar transistor. Alternatively, the negative charge may be injected into the charge storage patterns before or after recording data of the DRAM device. Alternatively, the negative charge may be injected into the charge storage patterns before reading data of the DRAM device. Programming data (for example, data "1") may be input into each cell of the DRAM by applying a first voltage, a second voltage and a third voltage to a gate electrode, a first impurity region and a second impurity region, respectively. The first voltage may be larger than the second voltage. The second voltage may be larger than the third voltage. Accordingly, holes may be accumulated in a semiconductor pattern opposite the gate. When the holes are accumulated in the semiconductor pattern, a threshold voltage becomes small.

Erasing data (for example, data "0") input into each cell of the DRAM by applying a fourth voltage, a fifth voltage and a sixth voltage to a gate electrode, a first impurity region and a second impurity region, respectively. The fourth voltage has a polarity opposite the fifth and sixth voltages. Accordingly, holes may be removed from the semiconductor pattern opposite the gate. When the holes are removed from the semiconductor pattern, a threshold voltage may rise.

The stored data may be read by applying a seventh voltage and an eighth voltage to the first impurity region. For example, data in each cell may be read by sensing threshold voltages of the vertical pillar transistor corresponding to each cell. The memory window may be increased by charges stored in the charge storage pattern. The above operating method may be applied to a DRAM device having a structure in which one unit cell includes one transistor and a charge storage pattern may be included in a gate insulation structure of the transistor.

Figure 2:
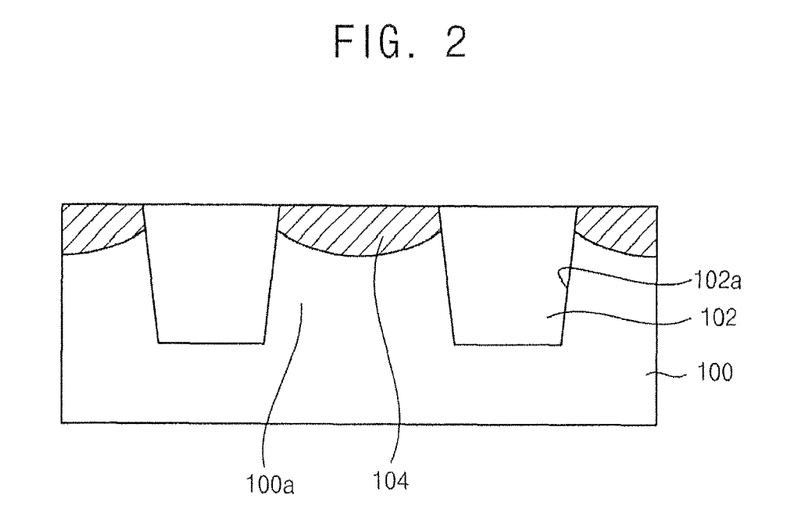
FIGS. 2-12 are cross-sectional views illustrating a method of manufacturing a DRAM device in FIG. 1.

FIGS. 2-12 are cross-sectional views illustrating a method of manufacturing a DRAM device in FIG. 1. Referring to FIG. 2, a substrate 100 having an active region 100a and an isolation layer 102 may be prepared. The substrate 100 may include single crystalline semiconductor material. For example, the substrate 100 may include single crystalline silicon. A trench 102a may be formed at an upper portion of the substrate 100 and the trench 102a may be filled with the isolation layer 102. Accordingly, the active region 100a and the isolation layer 102 having a shape extending along a first direction may be formed. The active region 100a and the isolation layer 102 may be alternatively formed at an upper portion of the substrate 100.

Impurities may be implanted in the substrate 100 to form a first impurity region 104. For example, the impurities may include n-type impurities. Alternatively, the impurity region may be formed before forming the isolation layer 102. In example embodiments, impurities implanted in a portion of the substrate may be removed by the shallow trench isolation process, so that the first impurity region 104 may only be formed on the active region.

Figure 3:
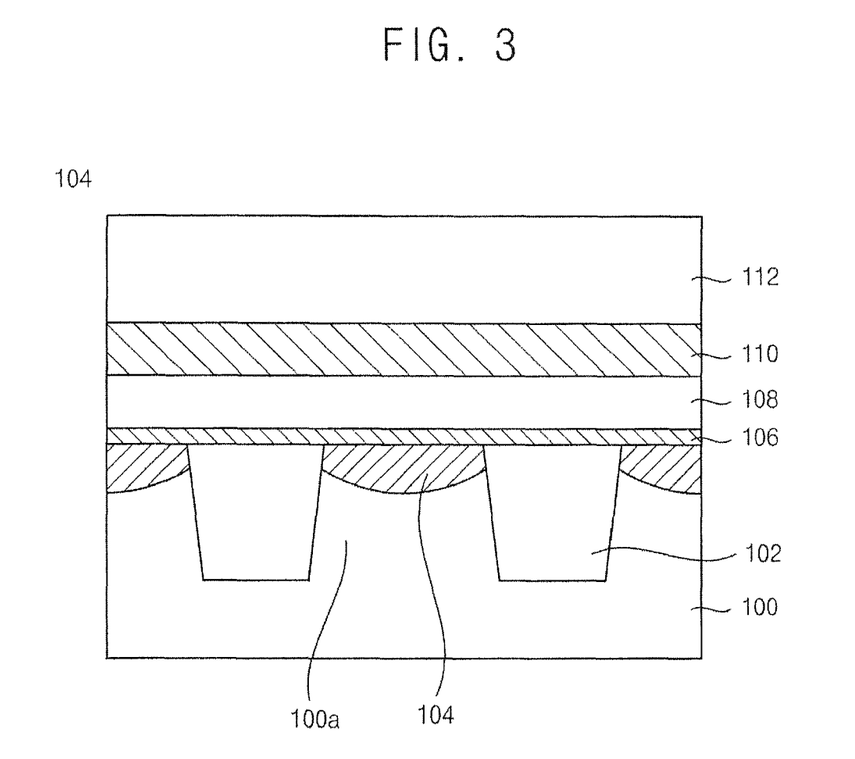

Referring to FIG. 3, a pad insulation layer 106, a first sacrificial layer 108, a first hard mask layer 110 and a second sacrificial layer 112 may be sequentially formed on the substrate 100. The first sacrificial layer 108 has an etching selectivity with respect to the first hard mask layer 110 and the pad insulation layer 106. When the first sacrificial layer 108 is removed, the first hard mask layer 110 and the pad insulation layer 106 may not be removed. Accordingly, for example, the first hard mask layer 110 and the pad insulation layer 106 may be formed using the same material. For example, the first hard mask layer 110 and the pad insulation layer 106 may be formed by depositing silicon nitride. The first and second sacrificial layers may be formed by depositing silicon oxide.

Figure 4:
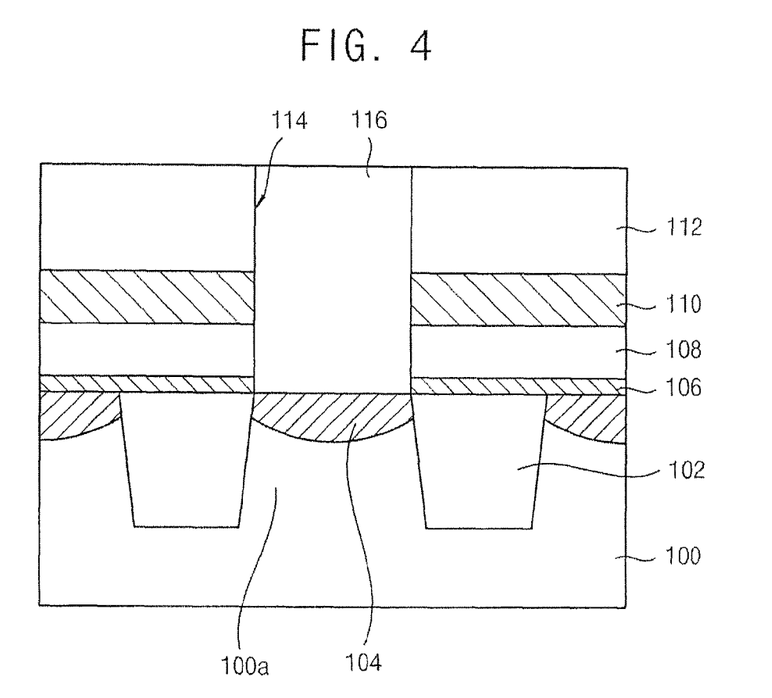

Referring to FIG. 4, a photoresist layer (not illustrated) may be coated on the second sacrificial layer 112. The photoresist layer may be patterned to form a first photoresist pattern (not illustrated). A portion exposed by the first photoresist pattern has a shape substantially the same as a single crystalline semiconductor pattern of pillar shape. The first photoresist patterns may be disposed in a predetermined or given interval.

The second sacrificial layer 112, the first hard mask layer 110, the first sacrificial layer and the pad insulation layer 106 may be sequentially etched to form a first opening 114. The first opening 114 has a contact hole shape. The first opening 114 may be filled with an amorphous silicon layer (not illustrated) or a polysilicon layer. The filling process may include a chemical vapor deposition (CVD) process. When the amorphous silicon layer is formed in the first opening 114, p-type impurities may be implanted in the amorphous silicon layer by in-situ. Accordingly, impurities may be implanted in a channel region of a vertical pillar transistor. The amorphous silicon layer may be polished to form a preliminary semiconductor pattern 116 until an upper face of the second sacrificial layer 112 is exposed.

Figure 5:
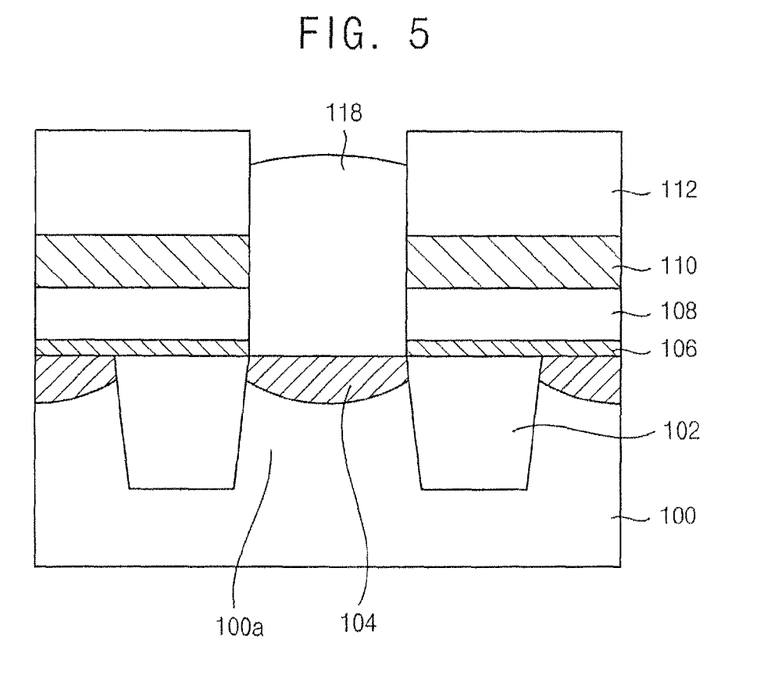

Referring to FIG. 5, a phase of the preliminary semiconductor pattern 116 may be transitioned to a single crystalline semiconductor pattern 118 including silicon. The phase transition process forming the single crystalline semiconductor pattern 118 may include a LEG process or a solid phase epitaxial (SPE) process. A heat treatment for generating the phase transition may be performed using a laser or a furnace. The laser used in the LEG process may have an energy density sufficient to melt the preliminary semiconductor pattern 116. When a crystal structure of the preliminary semiconductor pattern 116 is converted into single crystalline silicon, the single crystalline semiconductor pattern 118 may shrink to have a height smaller than a height of the preliminary semiconductor pattern 116.

Figure 6:
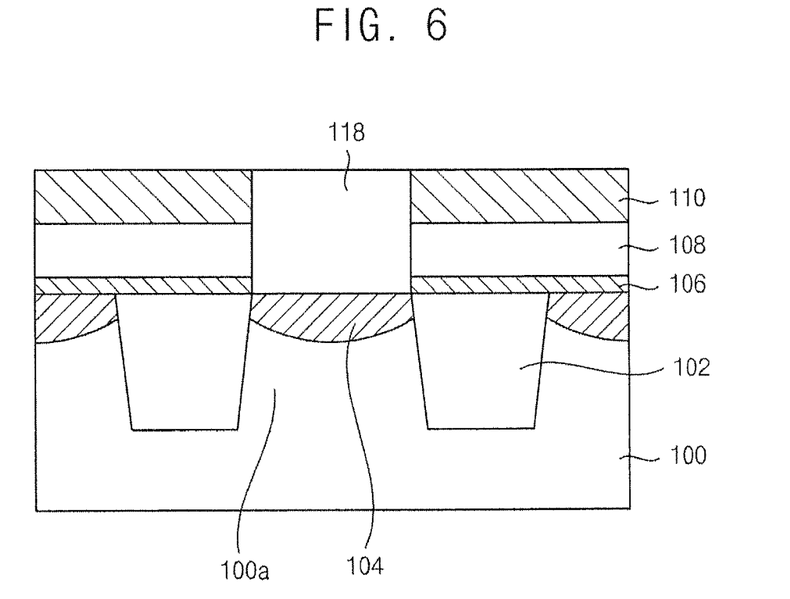

Referring to FIG. 6, the single crystalline semiconductor pattern 118 and the second sacrificial layer 112 may be polished to expose the first hard mask layer 110. The second sacrificial layer 112 may be completely removed by the polishing process. The single crystalline semiconductor pattern 118 has an upper face level to that of the first hard mask layer 110.

In example embodiments, impurities may be implanted in an exposed portion of the single crystalline semiconductor pattern 118 to form a second impurity region 124 (see FIG. 8) after forming the single crystalline semiconductor pattern 118. Forming a protective layer on the single crystalline semiconductor pattern 118 and the first hard mask layer 110 may be further performed after forming the second impurity region 124 (see FIG. 8). Alternatively, the second impurity region 124 may be formed by the following processes.

Figure 7:
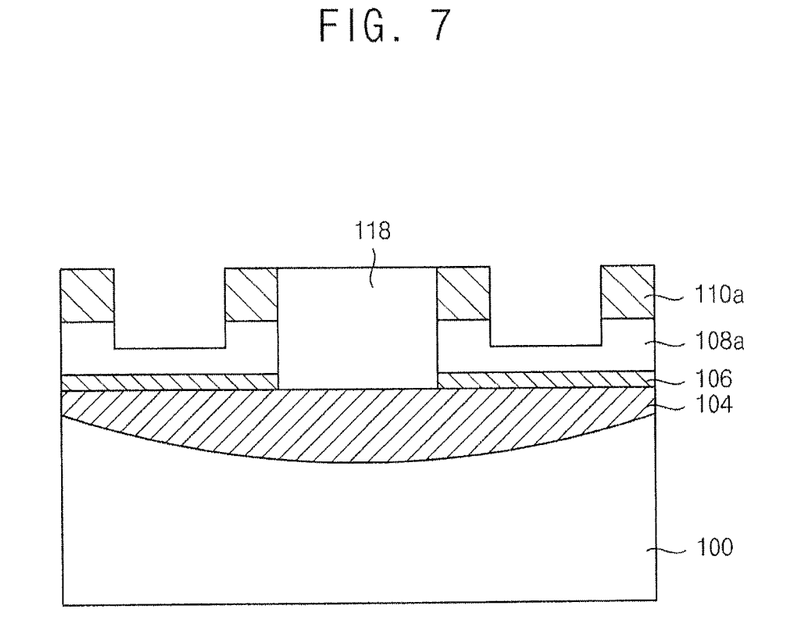

FIGS. 7 to 11 are cross-sectional views taken along a direction different from a direction of FIGS. 3 to 6. Referring to FIG. 7, a photoresist layer (not illustrated) may be formed on the first hard mask layer 110 and the single crystalline semiconductor pattern 118. The photoresist layer may be patterned to form a second photoresist layer pattern (not illustrated) having a linear shape. The second photoresist layer pattern extends along a second direction substantially perpendicular to the first direction. The second photoresist layer pattern covers the single crystalline semiconductor pattern 118.

The first hard mask layer 110 may be anisotropically etched using the second photoresist layer pattern as an etching mask. The first sacrificial layer 108 below the first hard mask layer 110 may be partially etched. Alternatively, the etching process anisotropically etching the first sacrificial layer 108 may not be performed.

The first hard mask pattern 110a may be formed by the anisotropic etching process. The first hard mask pattern 110a encloses a sidewall of the single crystalline semiconductor pattern 118 and has a linear shape extending along the second direction. The first hard mask patterns 110a may be spaced apart from each other in the first direction. A first sacrificial layer pattern 108a may be formed under the first hard mask pattern 110a.

Figure 8:
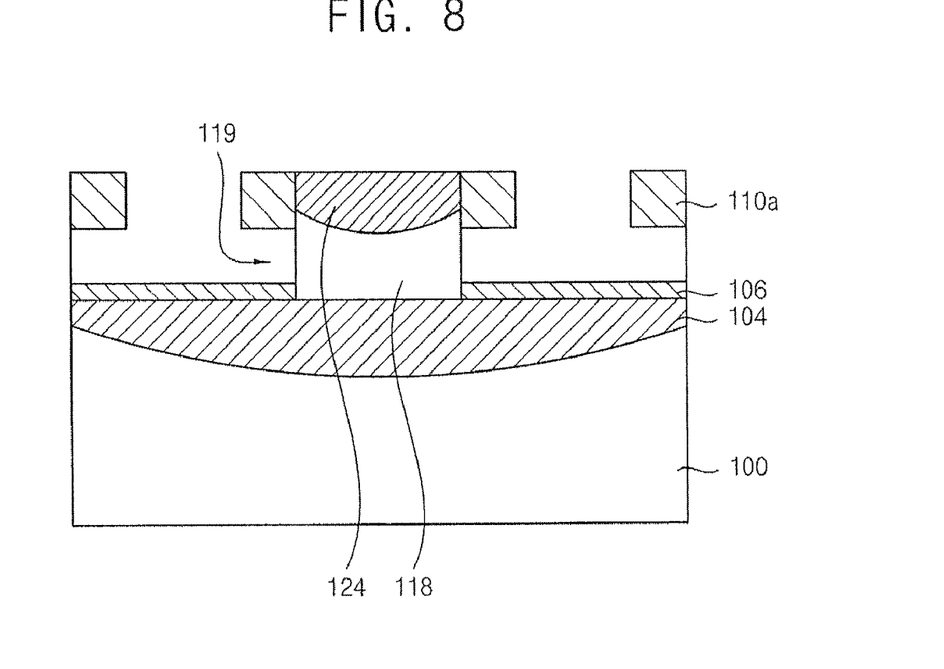

Referring to FIG. 8, the first sacrificial layer pattern 108a may be removed by an isotropic etching process. The first hard mask pattern 110a enclosing an upper sidewall of the single crystalline semiconductor pattern 118 may remain. Gaps 119 may be interposed between the first hard mask pattern 110a and substrates, and the adjacent first hard mask patterns 110a. The hard mask pattern 110a may not be supported by a layer thereunder. The first hard mask pattern 110a has a linear shape enclosing the single crystalline semiconductor pattern 118. Accordingly, a sidewall of the single crystalline semiconductor pattern 118 may be partially exposed under the first hard mask pattern 110a. A gate may be formed on the exposed portion of the sidewall of the single crystalline semiconductor pattern 118.

Figure 9:
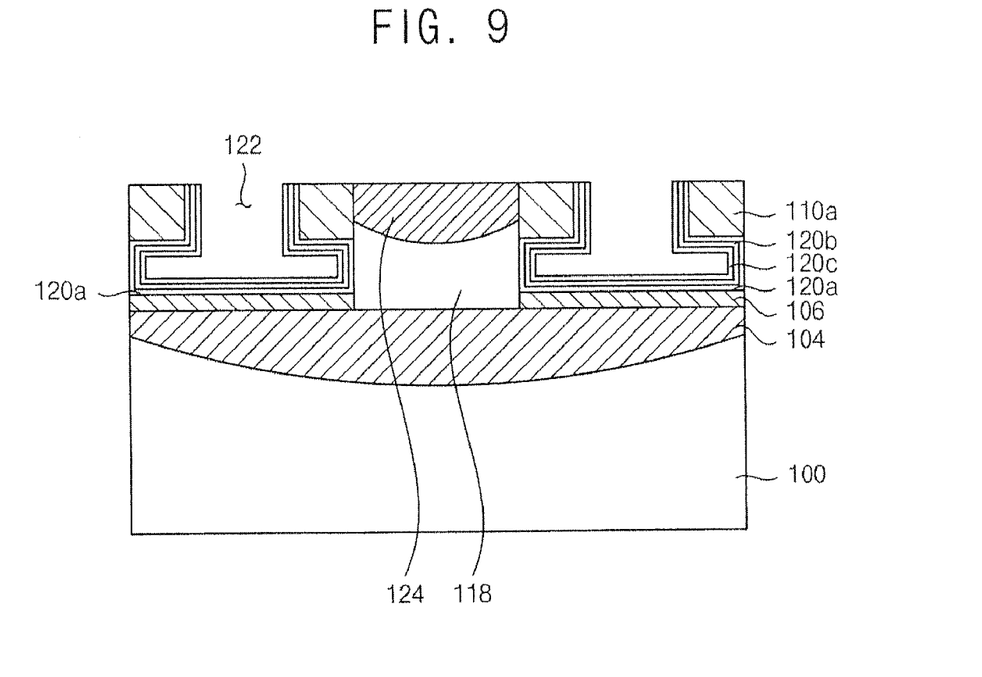

Referring to FIG. 9, the exposed sidewall of the single crystalline semiconductor pattern 118 may be thermally oxidized to form a gate insulation layer 120a. The gate insulation layer 120a may include silicon oxide formed by a thermal oxidation process. As illustrated, the gate insulation layer 120a may be formed along a sidewall of the single crystalline semiconductor pattern 118, a first hard mask pattern 110a and an upper face of the pad insulation layer 106. Alternatively, the gate insulation layer 120a may have a ring shape enclosing the exposed sidewall of the single crystalline semiconductor pattern 118.

A charge storage layer 120b may be formed on the gate insulation layer 120a. The charge storage layer 120b may include material having charge trap sites. For example, the charge storage layer 120b may include silicon nitride and/or metal oxide having higher permittivity. A blocking dielectric layer 120c may be formed on the charge storage layer 120b. The blocking dielectric layer 120c may be formed using silicon oxide and/or metal oxide having higher permittivity.

After forming the gate insulation layer 120a, the charge storage layer 120b and the blocking dielectric layer 120c, gaps 122 between the first hard mask pattern 110a and the substrate 100, and between the adjacent first hard mask patterns 110a still remain. For example, the gate insulation layer 120a, the charge storage layer 120b and the blocking dielectric layer 120c are sufficiently thin.

Figure 10:
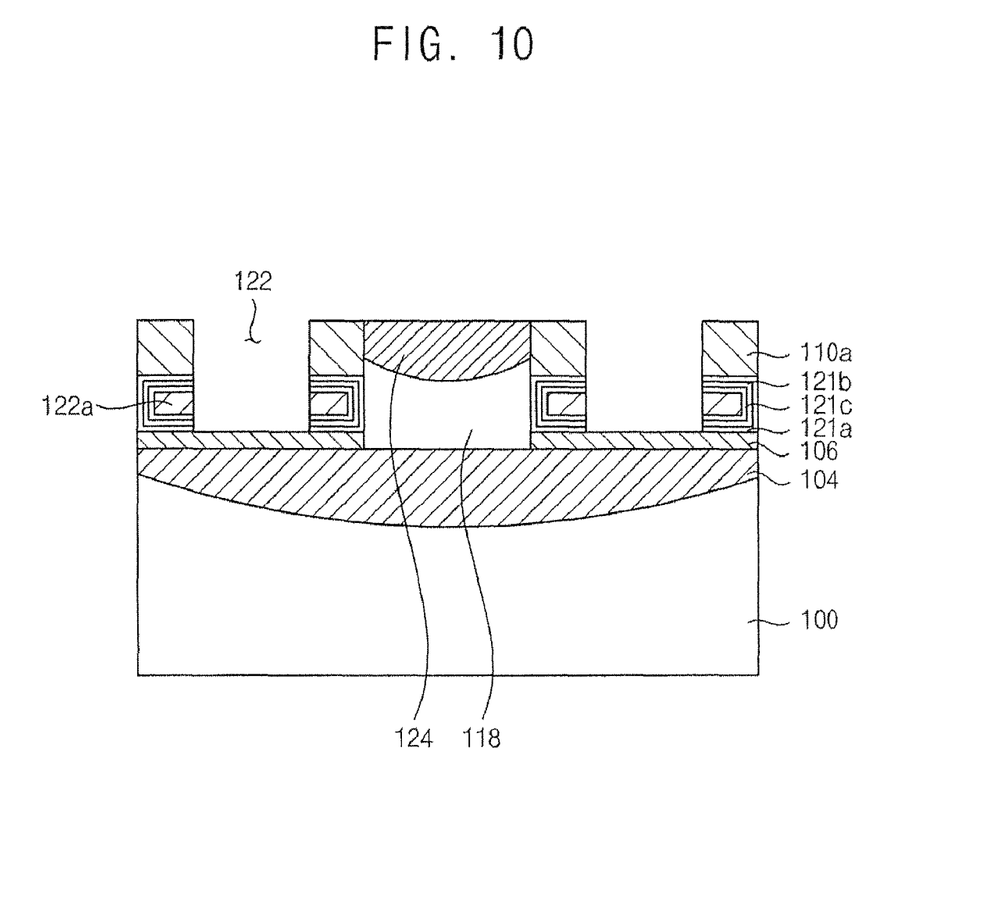

Referring to FIG. 10, a polysilicon layer (not illustrated) may be formed to fill the gaps between the first hard mask pattern 110a and the substrate 100, and between the adjacent first hard mask patterns 110a. The polysilicon layer may be doped with n-type impurities in in-situ when forming the polysilicon layer. The polysilicon layer may be polished to exposed an upper face of the first hard mask pattern 110a. A polysilicon layer pattern having a surface level to the first hard mask pattern 110a may be formed by the polishing process. An upper face of the single crystalline semiconductor pattern 118 may be exposed. The first hard mask pattern 110a serves as a polish stop layer in the polishing process. When the first hard mask pattern 110a is exposed, the polishing process may be stopped, so that a dicing phenomenon may be prevented or reduced.

Impurities may be implanted in an upper face of the single crystalline semiconductor pattern 118 to form a second impurity region 124. Because the polysilicon layer pattern may be disposed on sidewalls of the single crystalline semiconductor pattern 118, only the upper face of the single crystalline semiconductor pattern 118 may be exposed. Thus, a depth of the second impurity region 124 may be adjusted when forming the second impurity region 124.

The polysilicon layer pattern may be etched using the first hard mask pattern 110a as an etching mask to form a gate electrode 122a. A photoresist pattern (not illustrated) covering the first hard mask pattern 110a and the single crystalline semiconductor pattern 118 may be further formed. The gate electrode 122a has a linear shape extending along the second direction and encloses sidewalls of the single crystalline semiconductor pattern 118.

When the gate electrode 122a may be formed, the gate insulation layer 120a, the charge storage layer 120b and the blocking dielectric layer 120c on the first hard mask pattern 110a and the substrate 100 may be removed together to form the gate insulation structure 121 including a gate insulation layer pattern 121a, the charge storage layer pattern 121b and the blocking dielectric layer pattern 121c. A vertical pillar transistor of each DRAM cell may be formed. The single crystalline semiconductor pattern 118 serves as a channel region. The channel region has a floating body shape. Data may be stored in the channel region.

Figure 11:
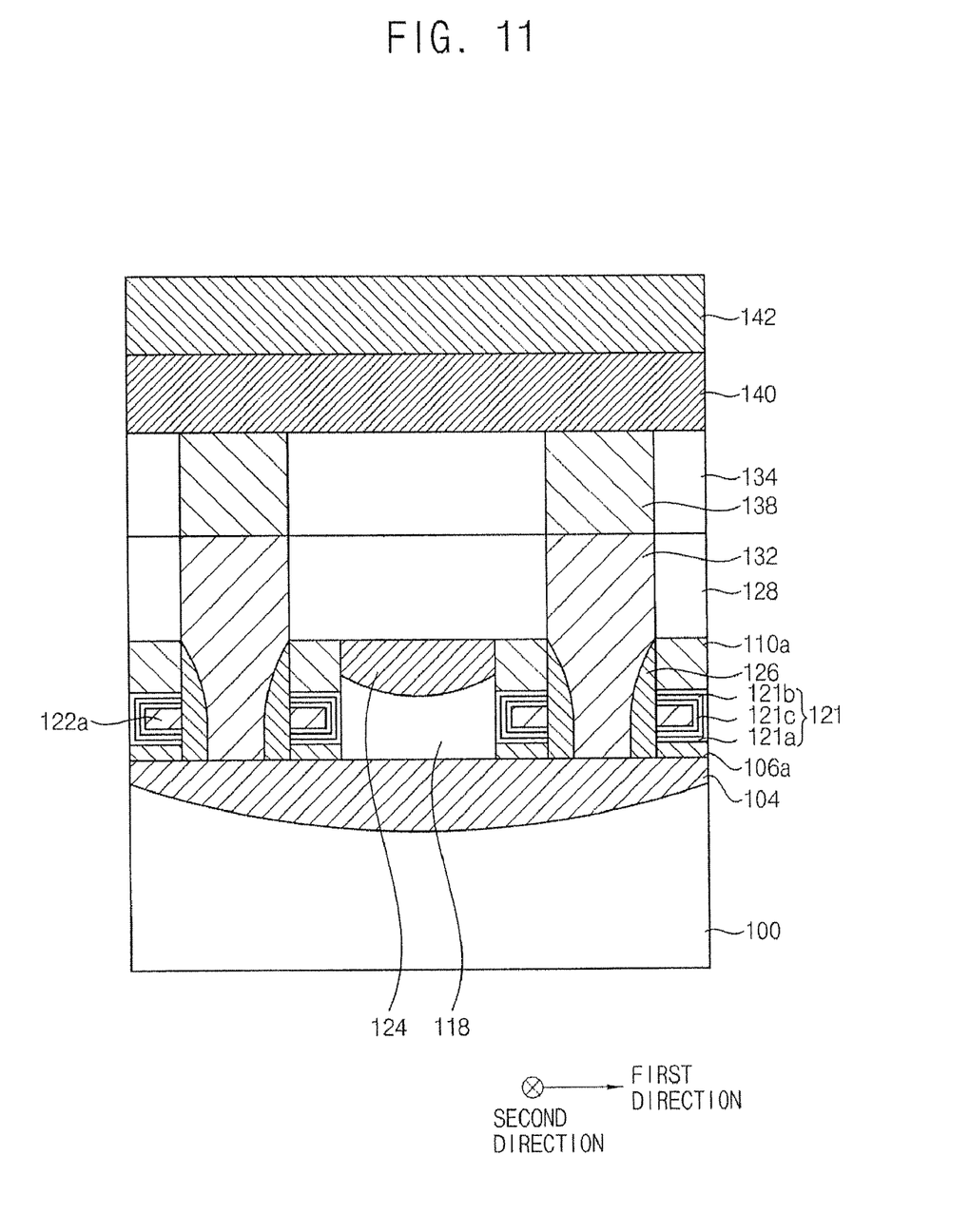

Referring to FIG. 11, the pad insulation layer 106 may be etched to form a pad insulation layer pattern 106a exposing the first impurity region 104. Accordingly, sidewalls of the gate electrode 122a, the first hard mask pattern 110a, the gate insulation structure 121 and the pad insulation layer pattern 106a may be exposed. An insulation layer (not illustrated) may be formed on the exposed substrate 100, the first hard mask pattern 110a and the exposed sidewalls of the gate electrode 122a, the first hard mask pattern 110a, the gate insulation structure 121 and the pad insulation layer pattern 106a. The insulation layer may include silicon nitride. The insulation layer may be anisotropically etched to faun a spacer 126 on the sidewalls of the gate electrode 122a, the first hard mask pattern 110a, the gate insulation structure 121 and the pad insulation layer pattern 106a.

A gap between the spacers may be filled with a first insulating interlayer 128. The first insulating interlayer 128 covers the first hard mask pattern 110a. The first insulating interlayer 128 may be formed by depositing silicon oxide. The first insulating interlayer 128 may be partially etched to form a contact hole (not illustrated) exposing the active region of the substrate 100. The contact hole may be filled with a conductive layer. The conductive layer may include polysilicon doped with impurities or metal. The conductive layer may be polished to form a pad contact 132 until a surface of the first insulating interlayer 128 is exposed.

A second insulating interlayer 134 may be formed on the pad contact 132 and the first hard mask pattern 110a. The second insulating interlayer 134 may be formed by depositing silicon oxide. The second insulating interlayer 134 may be partially etched to form a second contact hole (not illustrated) partially exposing the pad contact 132. The second contact hole may be filled with a conductive layer. The conductive layer may be polished to form a direct contact 138 until the second insulating interlayer 134 is exposed.

A conductive layer for a bit line may be formed on the direct contact 138. The conductive layer for a bit line may be foamed by depositing polysilicon, metal and/or metal silicide. These may be used in alone or a combination thereof. A second hard mask pattern 142 may be formed on the conductive layer for a bit line. The second hard mask pattern 142 may be formed by depositing silicon nitride and patterning the silicon nitride. The second hard mask pattern 142 has a linear shape opposite the direct contact and extending along the first direction.

The conductive layer for a bit line may be anisotropically etched using the second hard mask pattern 142 as an etching mask to form a bit line 140. The bit line 140 may be disposed between the adjacent single crystalline semiconductor patterns 118 parallel to each other in the first direction.

Figure 12:
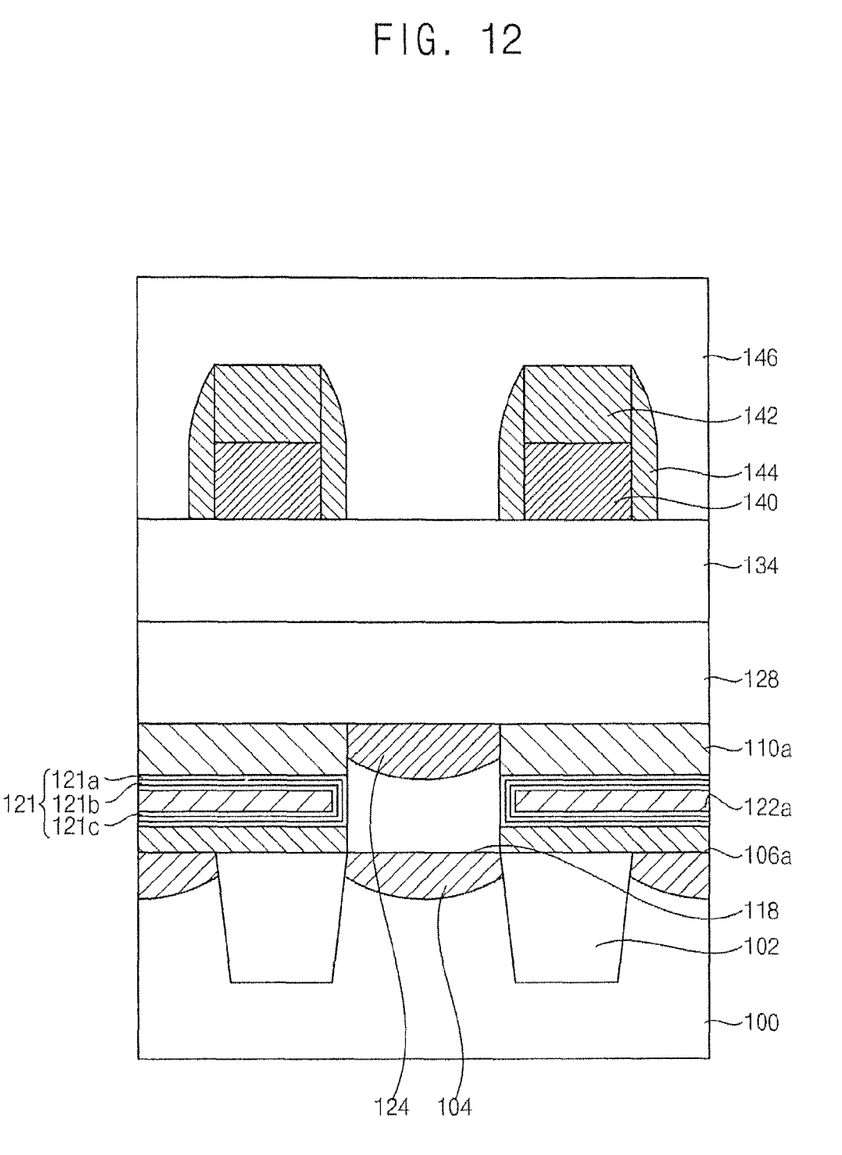

Referring to FIG. 12, an insulation layer for a spacer 144 may be formed on sidewalls of the bit line 140 and the second hard mask pattern 142, and a surface of the second insulating interlayer 134. The insulation layer for a spacer may be anisotropically etched to form the spacer 144 on the sidewalls of the bit line 140 and the second hard mask pattern 142. The spacer 144 may include silicon nitride.

A gap between the spacers 144 may be filled with a third insulating interlayer 146. The third insulating interlayer may covers the bit lines 140. The third insulating interlayer may be formed by depositing silicon oxide.

Referring to FIG. 1 again, portions of the first to third insulating interlayer 128, 134 and 146 between the bit lines 140 may be anisotropically etched to form a contact hole (not illustrated) exposing a second impurity region 124. The contact hole may be filled with a conductive material. The conductive material may be polished to form a contact plug 148 until the third insulating interlayer 146 may be exposed. The conductive material may include metal such that a resistance of the contact plug 148 may be reduced. Alternatively, the conductive material may include polysilicon.

A wiring 150 may be formed on the contact plug 148. The wiring may include metal. A metal layer may be formed on the contact plug 148. The metal layer may be patterned to form the wiring 150. The wiring 150 has a linear shape extending along the second direction and inputs electric signals to the contact plug 148.

The DRAM device manufactured by the above processes does not have a capacitor. Data may be recorded by injecting into or erasing holes from a pillar pattern of a single crystalline semiconductor using a floating body effect. Thus, processes for forming a capacitor may be not needed so that the DRAM may be manufactured by simpler processes.

Figure 13:
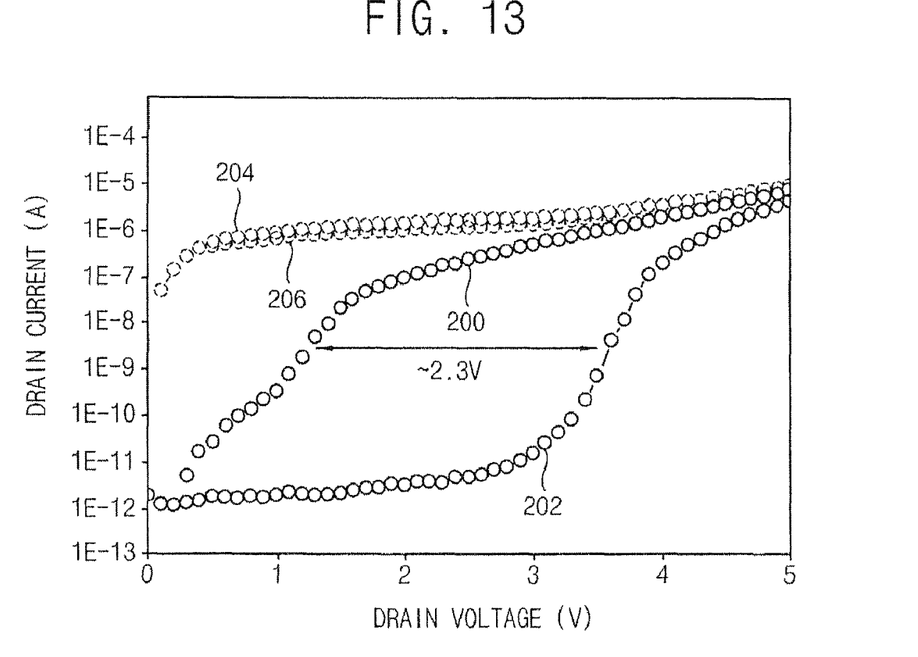
FIG. 13 is a graph showing each of drain currents of a DRAM device including a vertical pillar transistor in accordance with example embodiments according to charges stored in a charge storing pattern.

FIG. 13 is a graph showing each of drain currents of a DRAM device including a vertical pillar transistor in accordance with example embodiments according to charges stored in a charge storing pattern. When a charge was stored in a charge storage pattern and programming data was input into a channel region of a vertical pillar transistor, a drain current according to a voltage applied to the drain was measured with applying about 0 V to a gate electrode and the result was represented by reference numeral 200. When a charge was stored in a charge storage pattern and an erasing data was input in a channel region of a vertical pillar transistor, a drain current according to a voltage applied to the drain was measured with applying about 0 V to a gate electrode and the result was represented by reference numeral 202. Programming voltage for storing the charge was about 16V.

When a charge was not stored in a charge storage pattern and a programming data was input in a channel region of a vertical pillar transistor, a drain current according to a voltage applied to the drain was measured by applying about 0 V to a gate electrode and the result was represented by reference numeral 204. When a charge was not stored in a charge storage pattern and erasing data was input in a channel region of a vertical pillar transistor, a drain current according to a voltage applied to the drain was measured with applying about 0V to a gate electrode and the result was represented by reference numeral 206.

As illustrated in FIG. 13, when a charge was stored in the charge storage pattern, the vertical pillar transistor has a memory window of about 2.3V. For example, when a voltage applied to a gate electrode was fixed to a predetermined or given voltage, a difference between a drain voltage for obtaining a specific drain current in a condition where data was stored in the vertical pillar transistor and a drain voltage for obtaining the specific drain current in a condition where data was not stored in the vertical pillar transistor may be about 2.3V.

On the other hand, as shown in the reference numerals 204 and 206, when a charge was not stored in a charge storage pattern, drain currents according to drain voltages in the same conditions as those of the reference numerals 200 and 202 were measured. In example embodiments, a memory window was smaller. As described above, as a charge is stored in the charge storage pattern or not, the memory window has different values under the same conditions. As a result, a charge may be stored in the charge storage pattern, so that a difference between threshold voltages according to data recorded in the vertical pillar transistor becomes larger.

Figure 14:
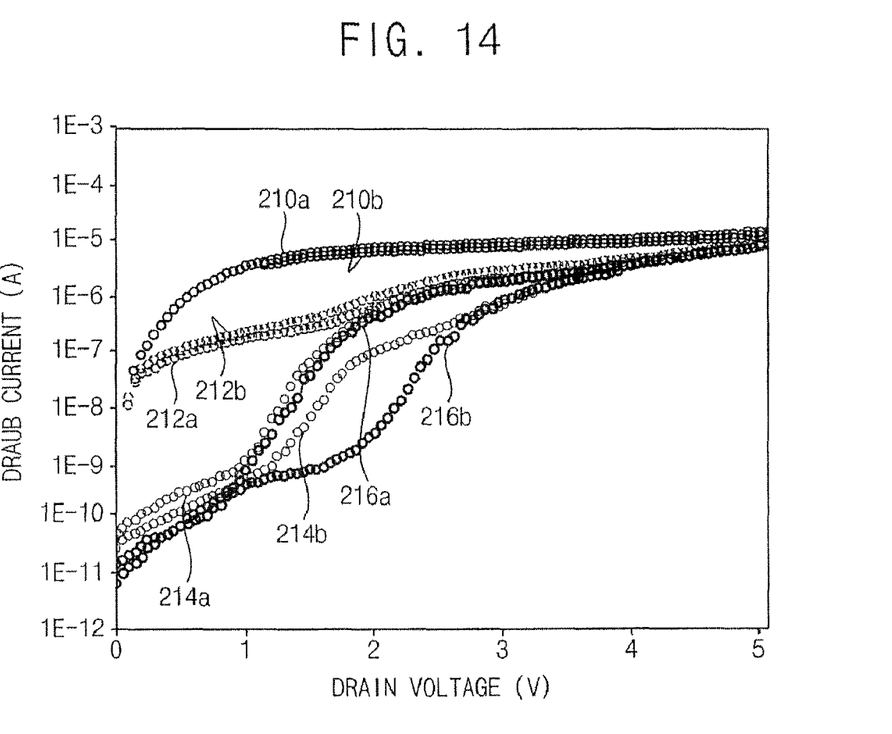
FIG. 14 is a graph each of drain currents of a DRAM device including a vertical pillar transistor in accordance with example embodiments according to programming conditions storing charges in a charge storing pattern.

FIG. 14 is a graph each of drain currents of a DRAM device including a vertical pillar transistor in accordance with example embodiments according to programming conditions storing charges in a charge storing pattern. Reference numerals 212a, 214a and 216a represent Vd-Id curves measured when a programming data may be input into a channel region of a vertical pillar transistor, respectively, with changing programming conditions for storing a charge into a charge storage pattern. Reference numerals 212b, 214b and 216b represent curves measured when erasing data may be input into a channel region of a vertical pillar transistor, respectively, with changing programming conditions for storing a charge into a charge storage pattern.

A programming voltage of about 10V for storing a charge was applied to a gate electrode of a vertical pillar transistor used in the curves represented by reference numerals 212a and 212b. A programming voltage of about 12V for storing a charge was applied to a gate electrode of a vertical pillar transistor used in the curves represented by reference numerals 214a and 214b. A programming voltage of about 14V for storing a charge was applied to a gate electrode of a vertical pillar transistor used in the curves represented by reference numerals 216a and 216b.

Reference numeral 210a represents a Vd-Id curve measured when programming data may be input into a channel region of a vertical pillar transistor and a charge may not be stored in a charge storage pattern. Reference numeral 210b represents a Vd-Id curve measured when erasing data may be input into a channel region of a vertical pillar transistor and a charge may not be stored in a charge storage pattern. Referring to FIG. 14, when the programming voltage is increased, the memory window rises. Thus, a desirable memory window may be obtained by adjusting the programming voltage.

According to example embodiments, the vertical pillar transistor may include only one transistor per cell and has a sufficient read sensing margin. Thus, the vertical pillar transistor may be used as a memory device in various electronic apparatuses having a higher integration degree.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical pillar semiconductor device comprising:
   a substrate including a first impurity region;
   a single crystalline semiconductor pattern on the first impurity region, the single crystalline semiconductor pattern having a pillar shape substantially perpendicular to the substrate and including a second impurity region in an upper portion of the single crystalline semiconductor pattern;
   a gate insulation layer structure including a charge storage pattern, the gate insulation layer structure on a sidewall of the single crystalline semiconductor pattern; and
   a gate electrode on the gate insulation layer structure and opposite the sidewall of the single crystalline semiconductor pattern, the gate electrode having an upper face lower than that of the single crystalline semiconductor pattern.

2. The vertical pillar semiconductor device of claim 1, wherein the charge storage pattern includes at least one of a silicon nitride and a metal nitride.

3. The vertical pillar semiconductor device of claim 1, further comprising:
   a first hard mask pattern enclosing an upper sidewall of the single crystalline semiconductor pattern,
   wherein the gate insulation layer structure has a linear shape and is on a bottom surface of the first hard mask pattern, a sidewall of the single crystalline semiconductor pattern and the substrate.

4. The vertical pillar semiconductor device of claim 1, further comprising:
   a channel doping region below a portion of the single crystalline semiconductor pattern configured to contact the gate insulation layer structure, the channel doping region changing a threshold voltage using a pair of electrons and holes generated according to electric conditions applied to the gate electrode, the first impurity region and the second impurity region.

5. The vertical pillar semiconductor device of claim 1, wherein charges are stored in the charge storage pattern for expanding a memory window.

6. The vertical pillar semiconductor device of claim 1, wherein the gate insulation layer structure includes an insulation layer pattern, the charge storage pattern and a blocking dielectric layer pattern that are laterally stacked.

7. The vertical pillar semiconductor device of claim 6, wherein the insulation layer pattern is made of silicon oxide.

8. The vertical pillar semiconductor device of claim 1, wherein the substrate further comprises an active region and an isolation layer, the substrate being made of single crystalline semiconductor material.

9. The vertical pillar semiconductor device of claim 8, wherein the active region and the isolation layer have a shape extending along a first direction.

10. The vertical pillar semiconductor device of claim 9, wherein the gate electrode has a linear shape extending along a second direction substantially perpendicular to the first direction.

11. The vertical pillar semiconductor device of claim 3, wherein the first hard mask pattern is made of silicon nitride and has an upper face having a surface even with the single crystalline semiconductor pattern.

12. The vertical pillar semiconductor device of claim 1, further comprising:
a pad insulation layer pattern between the substrate and a lower surface of the gate electrode,
wherein the pad insulation layer pattern is formed of silicon nitride.

13. The vertical pillar semiconductor device of claim 3, further comprising:
first and second insulating interlayers on the first hard mask pattern;
at least one bit line on the second insulating interlayer;
a second hard mask pattern on the at least one bit line; and
at least one spacer on a sidewall of the at least one bit line.

14. The vertical pillar semiconductor device of claim 13, further comprising:
a third insulating interlayer covering the at least one bit line;
a contact plug formed through the second and third insulating interlayers to contact an upper face of the single crystalline semiconductor pattern; and
a wiring on the contact plug.

* * * * *